United States Patent
Yoo

(10) Patent No.: US 7,281,929 B2
(45) Date of Patent: Oct. 16, 2007

(54) TAPE CARRIER PACKAGE

(75) Inventor: Se Joon Yoo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/420,918

(22) Filed: May 30, 2006

(65) Prior Publication Data

US 2006/0267971 A1    Nov. 30, 2006

(30) Foreign Application Priority Data

May 30, 2005    (KR) ...................... 10-2005-0045613

(51) Int. Cl.
*H01R 12/00*    (2006.01)
(52) U.S. Cl. ........................................ 439/67; 349/150
(58) Field of Classification Search .................. 439/67, 439/77; 349/149, 150
See application file for complete search history.

(56) References Cited

U.S. PATENT DOCUMENTS

| 6,982,694 | B2 * | 1/2006 | Matsuzaki | .................... 345/98 |
| 6,995,814 | B2 * | 2/2006 | Kanatsu | ........................ 349/58 |
| 7,012,667 | B2 * | 3/2006 | Pai | .............................. 349/152 |
| 7,033,185 | B2 * | 4/2006 | Kuo et al. | ..................... 439/67 |

* cited by examiner

*Primary Examiner*—Khiem Nguyen
(74) *Attorney, Agent, or Firm*—Fish & Richardson P.C.

(57) ABSTRACT

A tap tape of a tape carrier package prevents connection parts from being eroded. The tap tape includes a base film having a device hole formed to mount a driver chip for driving a panel of a flat panel display, input patterns positioned on the base film and having a plurality of electrode pads connected to a side of the device hole, output patterns positioned on the base film and having a plurality of electrode pads connected to the other side of the device hole; and connection parts positioned at the ends of the input patterns or the output patterns and having electrode pads of widths different from widths of the electrode pads.

18 Claims, 8 Drawing Sheets

TAPE CARRIER PACKAGE

This application claims the benefit of Korean Patent Application No. P2005-0045613, filed on May 30, 2005, which is hereby incorporated by reference as if fully set forth herein.

BACKGROUND OF THE INVENTION

1. Field of the Invention

The present invention relates to a tape carrier package, and more particularly, to a tape carrier package for preventing connection parts from eroding.

2. Discussion of the Related Art

Recently, as contemporary society develops toward an information society, importance of a flat panel display device as an information display device is gradually increasing. Particularly, due to features and advantages such as high image quality, lightweight, thinness, and low power consumption, the LCD is most widely used as a portable display device to substitute a cathode ray tube (CRT).

There are various flat panel display devices such as a liquid crystal display device (LCD), a plasma display panel (PDP), an electro-luminescence (EL) device, and the like. Generally, the flat panel display device includes a plurality of driver chips mounted therein to drive the flat panel display device.

The driver chip, among components mounted in the flat panel display device, is a very important component for determining performance of the flat panel display device.

In order to mount the driver chip to the flat panel display device, a tape carrier package (hereinafter referred to as 'TCP') is chiefly used.

Here, the TCP means a package utilizing a tape automated bonding technology for bonding a bump of the driver chip to an inner lead of the TCP by thermo-compression and for sealing the same with resin, as a wireless bonding method among the mounting technologies used in a highly integrated semiconductor chip such as an LSI.

When the TCP is used among the mounting methods of a driver chip in the flat panel display device, since costs for the package are decreased and the supply and attachment of the packages can be automatically performed, the TCP method is widely utilized.

FIG. 1 is a plan view illustrating a conventional tap tape of the TCP. For reference, this plan view depicts a tap tape for a single TCP, but actually, such tap tapes of the TCP are formed repeatedly.

As shown in the drawing, the tap tape of a TCP has a structure in that wiring patterns are formed by patterning copper (Cu) foil on a polyimide base film. In the base film 10, a device hole 11 is formed to mount the driver chips (not shown) by the inner bonding. Along the lateral sides of the base film 10, sprocket holes 12 are formed at a regular interval.

Here, the driver chips are mounted on the tap tape by bonding the bumps of the driver chips to the inner leads of the device holes 11 by the thermo-compression and coating the sealing resin thereon.

The sprocket holes 12 guide the alignment and movement of the tap tapes of the TCPs such that the tap tapes can be continuously supplied from a reel to another reel during the manufacturing of the tap tapes of the TCP.

The wiring patterns include input patterns 13 extending from the center of the device hole 11 to a side of the tap tape and output patterns 14 extending from the center of the device hole 11 to the other side of the tap tape. Here, the input patterns 13 are connected to a connector of a printed circuit board and the output patterns 14 are aligned with and connected to input pads of a panel of the flat panel display device. The wiring patterns made of the copper foil are coated with Sn or Au.

The base film 10 has first slits 15 and second slits 16 for distributing stress generated when bending the TCP. The first slit 15 and the second slits 16 are formed in regions of the sprocket holes 12 positioned at the lower side of the device hole 11.

Although individual tap tape of the TCP has been described above, actually, the tap tape of the TCP is wound around a taping roller in the form of a reel and must be cut off by a cutting machine having a specific shape such that the TCP is connected to the panel of the flat panel display device and the printed circuit board (PCB).

The input patterns of the conventional tap tape of the TCP, as shown in FIG. 2, are formed in the region outside a cutting line 20 to be cut by the cutting machine and has pads to be connected to the connector of the printed circuit board and having the same width. Parts formed in a region outside the cutting line 200 are test pads 40.

When the tap tape of the TCP is cut off by the cutting machine and separated from each other individually, as shown in FIG. 3, the TCP 50 is connected to the panel 60 of the flat panel display device and to a connector 75 of a printed circuit board 70 by which the output patterns are aligned with input pads of the panel 60 of the flat panel display device by the film 80 and the input patterns of the TCP 50 are connected to the connector 75 of the printed circuit board 70 disposed lower than the panel 60.

In a case of the PDP, the input patterns of the TCP 50 are connected to the printed circuit board 70 chiefly by the connector 75. Here, the state that the input patterns of the TCP are internally connected to the connector of the printed circuit board is depicted in FIGS. 4A and 4B.

As shown in the drawing, the connector 100 of the printed circuit board has plastic bodies 110 arranged at regular intervals and copper (Cu) pins 120 arranged between the bodies 110 at regular intervals.

When pads 130 of the input patterns of the TCP are connected to the connector 100, the pads 130 of the input patterns of the TCP electrically contact the pins 120 of the connector 100 for the electrical connection thereof. At this time, the pads 130 of the input patterns of the TCP contact the pins 120 of the connector 100 and the bodies 110 of the connector 100.

In the PDP, a very high voltage as a driving power is required, and when the PDP is used for a long time at a place where relative humidity is high, Sn plating layers of the connections where the pads 130 of the input patterns contact the bodies 110 of the connector 100 are eroded.

In other words, although the bodies 110 are made of insulator, the bodies 110 of the connector 100 are in a grounded state when a high voltage is applied to the pads 130 of the input patterns contacting the bodies 110 and humidity is high. At this time, due to the potential difference between the bodies 110 and the pads 130 of the input patterns, the Sn plating layers of the connections where the pads 130 of the input patterns contact the bodies 110 of the connector 100 are eroded.

Moreover, when the Sn plating layers of the input patterns are eroded, Cu patterns formed in the lower sides of the Sn plating layers are exposed to humidity. When the Cu patterns are exposed to humidity, the Cu patterns are eroded and electrical shorting is generated.

When plating layers are formed on the input patterns with Au, the pads 130 of the input patterns are minimally eroded even when the pads 130 contact the bodies 110 of the connector. However, the Au plating is expensive.

SUMMARY OF THE INVENTION

Accordingly, present invention is directed to a tape carrier package that substantially obviates one or more problems due to limitations and disadvantages of the related art.

An object of the present invention is to provide a tape carrier package in which, when the tap tape of a tape carrier package is connected to a connector of a printed circuit board, a part of an input pattern of the tape carrier package neighboring bodies of the connector are prevented from being eroded.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a tape carrier package of a panel of a flat panel display includes a base film having a device hole to mount driving chips for driving the panel, an input pattern positioned on the base film and having a plurality of electrode pads connected to a side of the device hole, an output pattern positioned on the base film and having a plurality of electrode pads connected to the other side of the device hole, and connection parts positioned at the ends of the input pattern or the output pattern and having electrode pads of widths different from widths of the electrode pads.

The connection parts connect the input pattern to a connector of a printed circuit board.

The connection parts may have electrode pads formed at intervals wider than intervals between the electrode pads of the input pattern or may have electrode pads of widths narrower than widths of the electrode pads of the input pattern.

Moreover, the connection parts include first connection parts connected to the electrode pads of the input patterns, and second connection parts having electrode pads of widths different from widths of the first connection parts and being connected to the connector.

In this case, the second connection parts may have electrode pads formed at intervals wider than intervals between the first connection parts. Thus, the second connection parts may have electrode pads of widths narrower than widths of the first connection parts.

Preferably, the electrode pads of the second connection parts have widths such that the electrode pads are prevented from contacting bodies of the connector when the electrode pads are connected to the connector.

The second connection parts further include test pads formed at the ends of the second connection parts.

Moreover, the electrode pads of the connection parts may be formed by dividing the electrode pads of the input pattern, or at least one of the input pattern, the output pattern, and the connection parts may be plated with tin.

The tape carrier package further includes a solder resist layer formed on the base film to cover or surround the input pattern and the output pattern.

The base film further comprises at least one slit so that smooth curvatures of the base film can be achieved.

Preferably, the connection between the output pattern and the panel of the flat panel display is established by an isotropic conductive film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of a tape carrier package of the present invention, examples of which are illustrated in the accompanying drawings, FIGS. 5 to 7.

Figure 1:
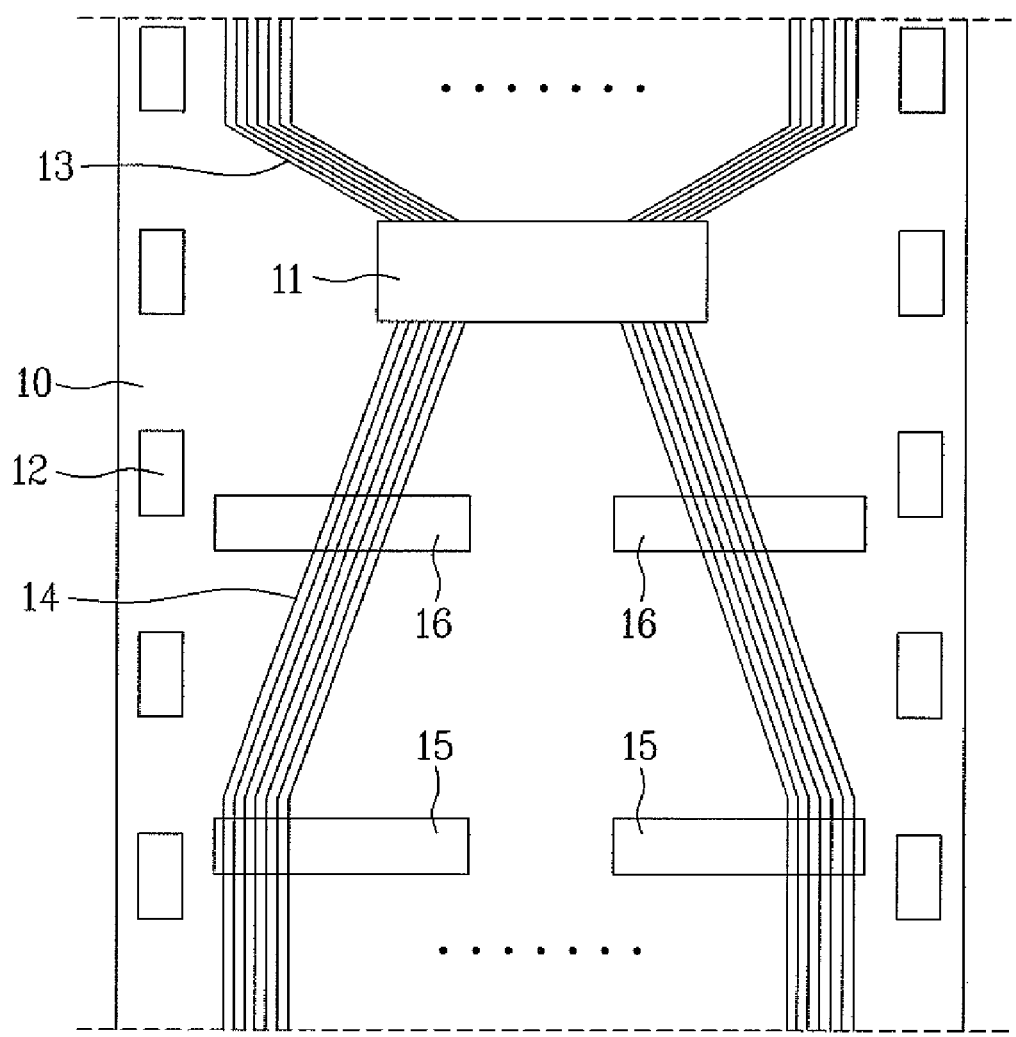
FIG. 1 is a plan view illustrating a conventional tap tape of a tape carrier package.
Figure 2:
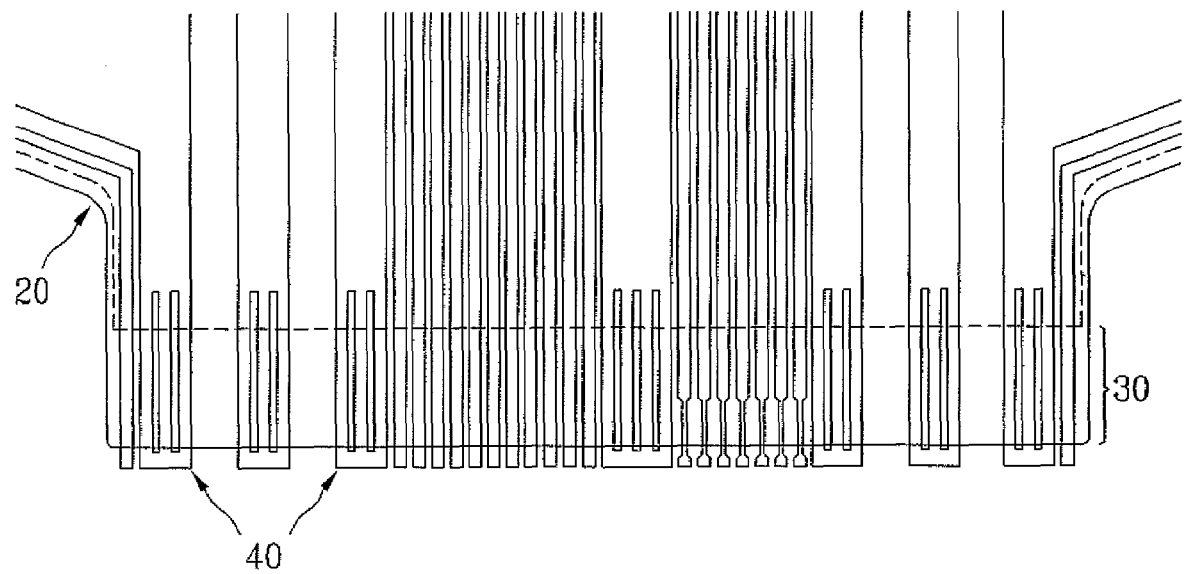
FIG. 2 is a view illustrating input patterns of the conventional tap tape of a tape carrier package.
Figure 3:
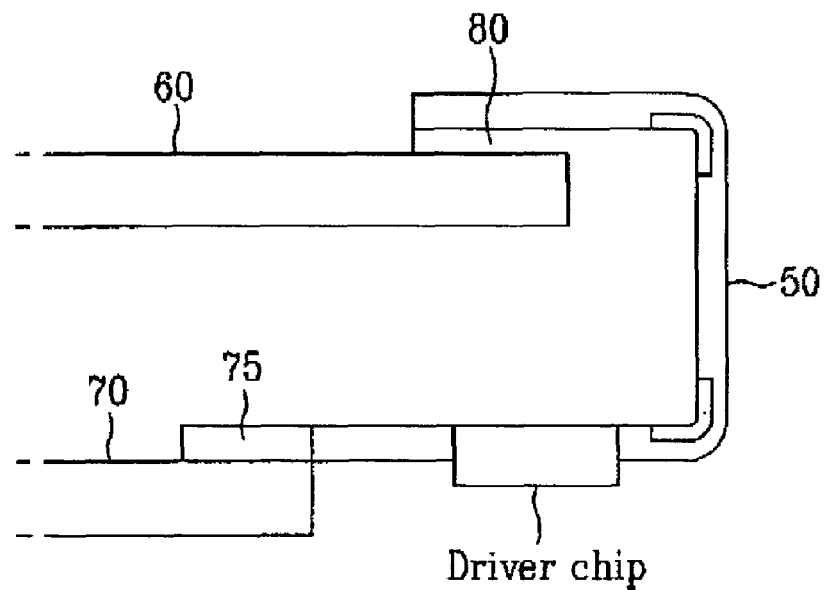
FIG. 3 is a view illustrating the contact of the tape carrier package with a panel of a flat panel display device and a connector of a printed circuit board.
Figure 4A:
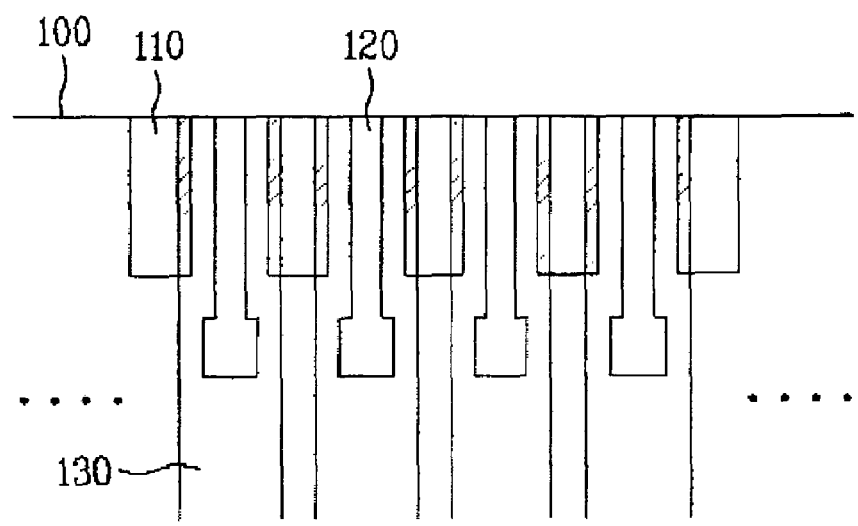
FIGS. 4A and 4B illustrate an internal connection between the input patterns of the conventional tape carrier package and the connector of the printed circuit board, shown in an overlapping state and non-overlapping state, respectively.
Figure 4B:
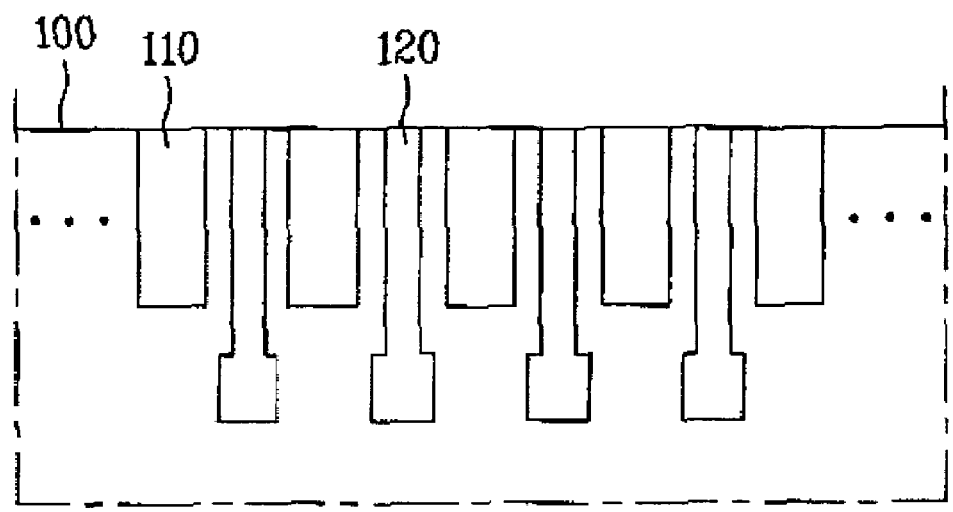
Figure 4B:
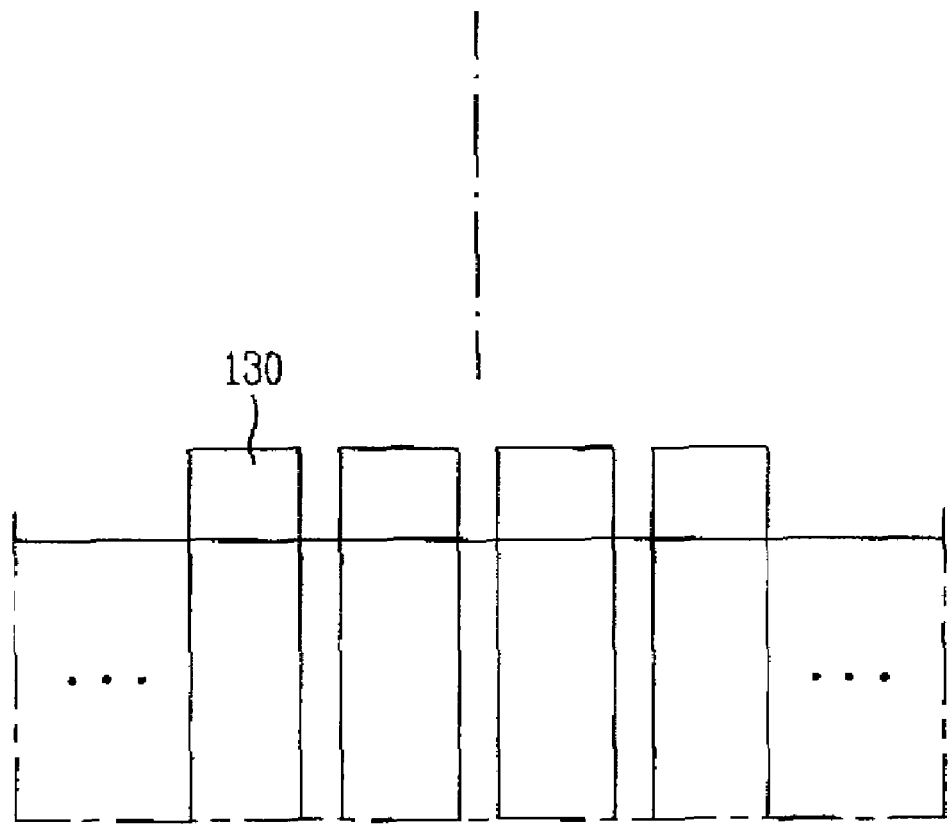
Figure 5:
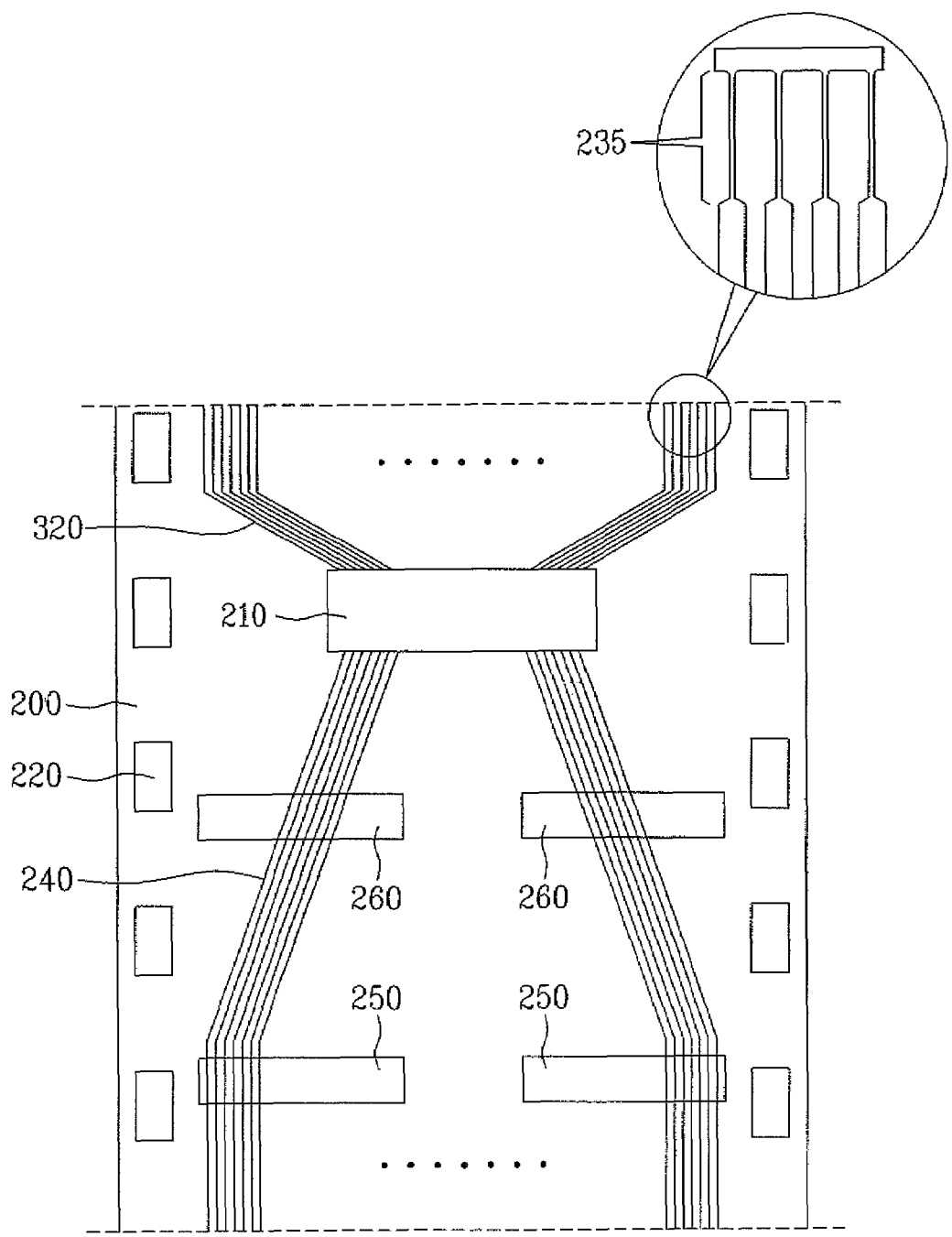
FIG. 5 is a plan side view illustrating a tape carrier package according to a preferred embodiment of the present invention.

FIG. 5 is a plan side view illustrating of a tape carrier package according to a preferred embodiment of the present invention.

As shown in the drawing, the tape carrier package, according to the preferred embodiment of the present invention, has a structure in that wiring patterns are formed by patterning copper (Cu) foil on a polyimide base film. In the base film 200, a device hole 210 is formed to mount driver chips (not shown) by the inner bonding. Along the lateral sides of the base film 200, sprocket holes 220 are formed at a regular interval.

The wiring patterns include input patterns 230 extending from the center of the device hole 210 to a side of the tap tape and output patterns 240 extending from the center of the device hole 210 to the other side of the tap tape. Here, the input patterns 230 have pads. Each of the pads has one end electrically connected to the driver chip and the other end connected to the connector of the printed circuit board.

The input patterns 230 have connection parts 235 of the pads 230 to be connected to the connector of the printed circuit board and having a width narrower than other parts of the pads 230. The connection parts 235 will be described in detail later.

The output patterns 240 have pads whose ends are electrically connected to the driver chip and whose the other ends are aligned with and connected to input pads of a panel of the flat panel display device. The Cu foil wiring patterns are plated with Sn.

In this case, an isotropic conductive film (ACF) is used to connect the output patterns to the input pads of the panel of the flat panel display device. The basic principle of the connection using the isotropic film is as follows.

After the isotropic film containing conductive particles is attached on the input pads that are formed to input a driving signal of the panel of the flat panel display, the output patterns of the tape carrier package are positioned at the upper sides of the isotropic film and are thermally compressed for the electrical connection.

The isotropic film has an adhesive and the conductive particles. The adhesive is melted by heating the isotropic film and the isotropic film is pressed such that the conductive particles are positioned between the output patterns and the input patterns of the panel to obtain conductivity.

Moreover, since adhesive is filled between the input pads of the panel and conductive particles present therebetween are independent, high degree insulation can be achieved between the input patterns of the panel.

When the input patterns of the tape carrier package are connected to the printed circuit board, the isotropic film may be used like the case of the connection between the output patterns of the tape carrier package and the panel of the flat panel display device, or a connector 400 (See FIGS. 7A and 7B) of the printed circuit board may be also used.

Particularly, in the plasma display panel, since a printed circuit board of the plasma display panel is relatively larger than a printed circuit board of the liquid crystal display and easily undergoes thermal deformation, alignment tolerance is increased when the isotropic film is used and it is difficult to perform the thermo-compression Meanwhile, the base film 200 has first slits 250 and second slits 260 for distributing stress generated when bending the TCP. The first slit 250 and the second slits 260 are formed in regions of the sprocket holes 220 positioned at the lower side of the device hole 210.

Figure 6:
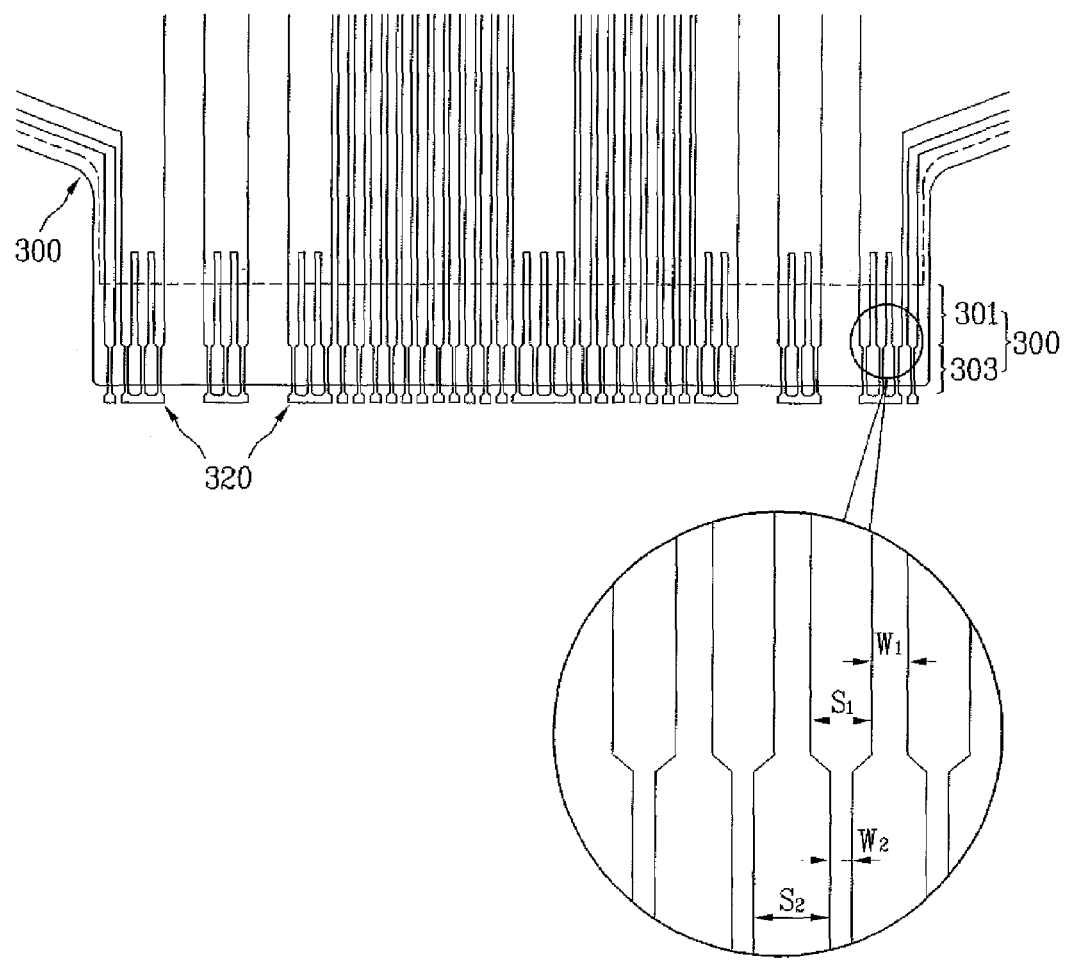
FIG. 6 is a view illustrating input patterns of the tape carrier package according to the preferred embodiment of the present invention.

FIG. 6 is a view illustrating input patterns of the tape carrier package according to the preferred embodiment of the present invention. As shown in the drawing, the input patterns of the tap tape according to the preferred embodiment of the present invention have connection parts 300 of the pads to be connected to the connector of the printed circuit board that have a width narrower than other parts of the pads.

In other words, the connection parts 300 of the input patterns to be connected to the connector of the printed circuit board are divided into two parts: there are parts (first connection parts 301) where pins of the connector contact the pads of the input patterns and there are other parts (second connection parts 303) where bodies of the connectors are adjacent to the pads of the input patterns.

Here, in the parts 301, among the parts where the input patterns are connected to the connector, where the pins of the connector contact the pads of the input patterns, widths of the pads of the input patterns are equal to widths of the pads of the input patterns extending from the device hole.

Moreover, in the parts 303, among the parts where the input patterns are connected to the connector, where the bodies of the connector are adjacent to the pads of the input patterns, widths of the pads of the input patterns are narrower than widths of the pads of the input patterns contacting the pins of the connector.

In other words, the widths $W_2$ of the pads of the parts 303 where the input patterns are adjacent to the bodies of the connector are narrower than the widths $W_1$ of the pads of the parts 301 where the input patterns contact the pins of the connector. Gaps S2 between the pads of the parts 303, where the input patterns are adjacent to the bodies of the connector, are wider than gaps S1 between the pads of the parts 301, where the input patterns contact the pins of the connector.

As such, the reason, that the widths $W_2$ of the pads of the parts 303 where the input patterns neighbor the bodies of the connector are narrower than the widths $W_1$ of the pads of the parts 301 where the input patterns contact the pins of the connector, is to prevent the parts 303, where the input patterns neighbor the bodies of the connector, from contacting the bodies of the connector.

Test pads 302 are formed at the ends of the input patterns. After manufacturing the tape carrier package, a test for checking whether or not the manufactured tape carrier package is inferior is carried out using a probe card. When probe needles installed in the probe card contact the pads of the input patterns positioned inside a cutting line 310, since pads, that are actually used, may be damaged, the test pads 320 are formed outside the cutting line 310.

Thus, the probe needles installed in the probe card contact the test pads 320 formed outside the cutting line 310 to check whether or not the tap tape of the tape carrier package is inferior.

As such, in the case that the widths of the pads of the parts 303 neighboring the bodies of the connector are narrower than widths of the pads of the input patterns contacting the pins of the connector, when the cutting of the tap tape of the tape carrier package is performed by a cutting machine after testing whether or not the tap tape of the tape carrier package is inferior, since area to be cut is decreased, the lifespan of the cutting machine is prolonged and reduced quantity of foreign metal substances is generated during the cutting.

Figure 7A:
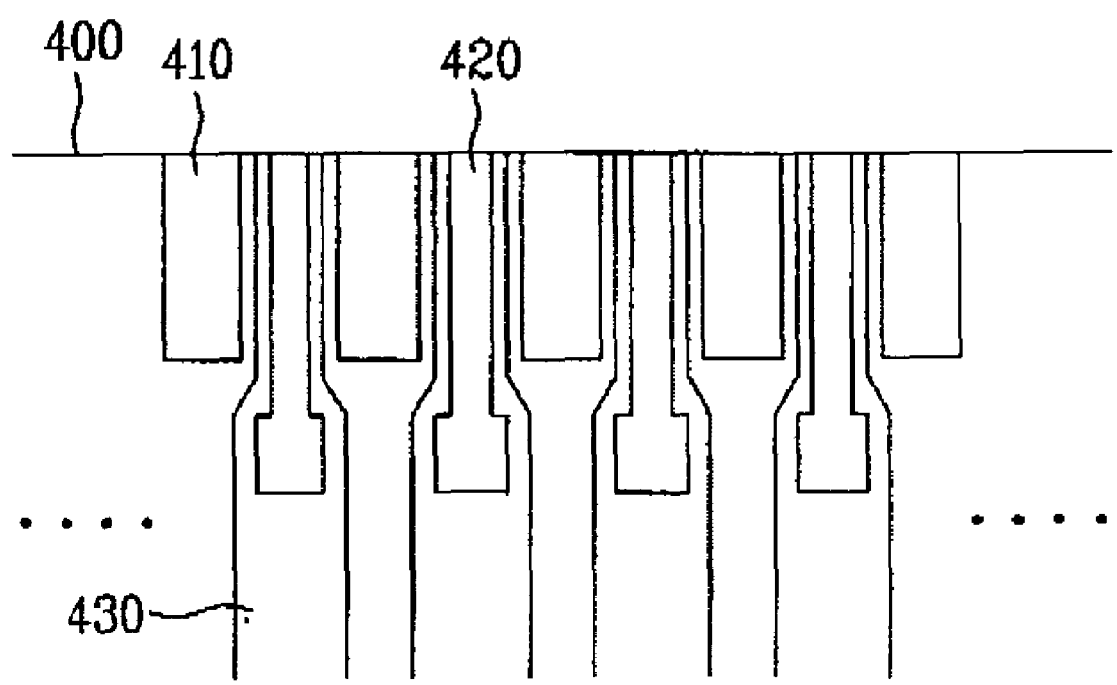
FIGS. 7A and 7B illustrate an internal connection between the input patterns of the tape carrier package according to the preferred embodiment of the present invention and the connector of the printed circuit board, shown in an overlapping state and a non-overlapping state, respectively.
Figure 7B:
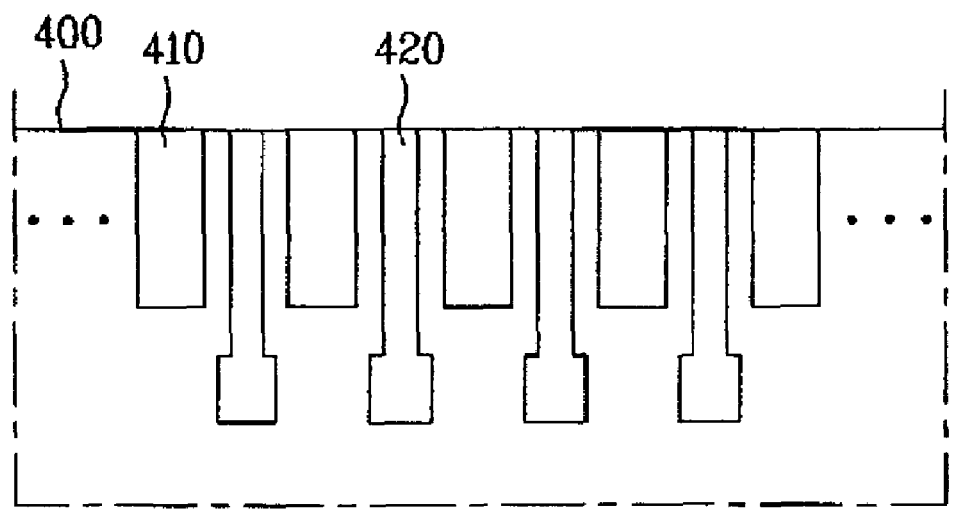
Figure 7B:
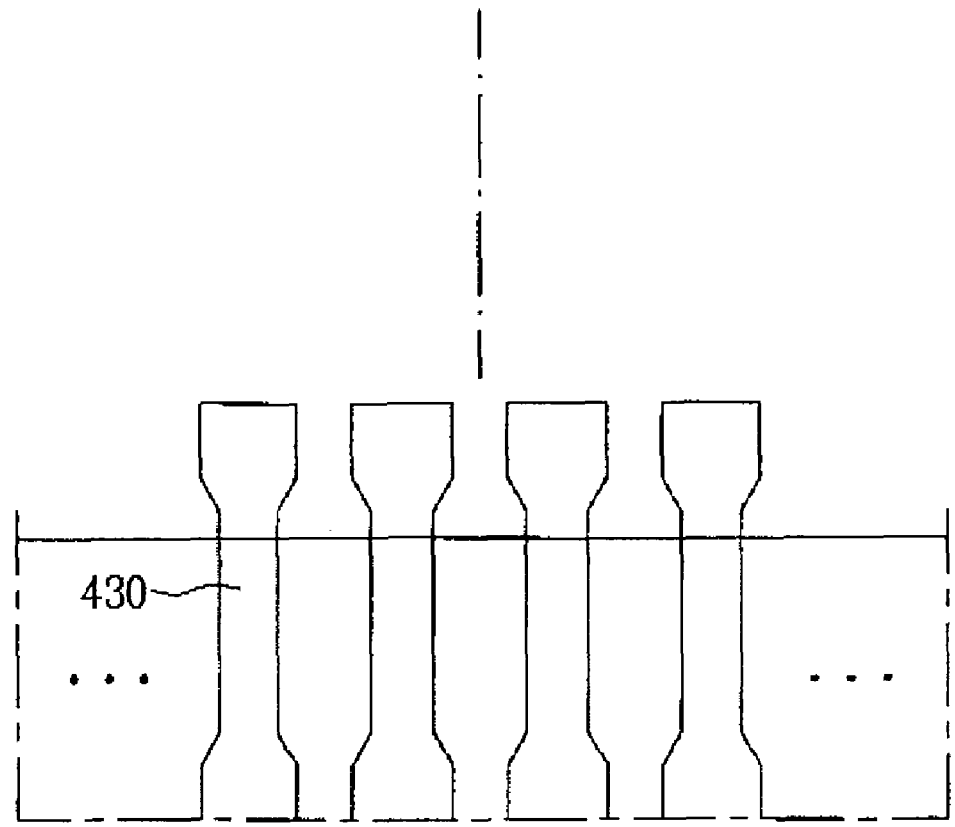

FIGS. 7A and 7B illustrate an internal connection between the input patterns of the tape carrier package according to the preferred embodiment of the present invention and the connector of the printed circuit board, shown in an overlapping state and a non-overlapping state, respectively. As shown in the drawing, the connector 400 of the printed circuit board includes the bodies 410 arranged at regular intervals and the pins 420 arranged between the bodies 410 at regular intervals.

The pads 430 of the input patterns of the tape carrier package contacts the pins 420 of the connector to be electrically connected thereto. Since the widths of the pads are narrow, the parts contacting the bodies of the conventional connector, among the pads 430 of the input patterns of the tape carrier package, do not contact the bodies of the connector.

Thus, after the tape carrier package is connected to the connector of the printed circuit board, although the tape carrier package is used for a long time under the circumstance of high voltage and high humidity, the Sn plating layer of the input patterns of the tape carrier package are not eroded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As described above, when the tap tape of a tape carrier package according to the present invention is connected to the connector of the printed circuit board, in the parts contacting the bodies of the connector among the input patterns of the tape carrier package, the widths of the pads are narrow and the gaps between the pads are wide. Thus, although the tap tape is used for a long time under the circumstance of high humidity, the Sn plating layer on the input patterns is not eroded so that signal processing between the tape carrier package and the printed circuit board can be smoothly performed.

Moreover, when the cutting process is performed by the cutting machine after testing whether or not the tap tape of the tape carrier package is inferior, since the cutting area is decreased, the lifespan of the cutting machine is prolonged and reduced quantity of the foreign metal substances is generated during the cutting process.

What is claimed is:

1. A tape carrier package of a panel of a flat panel display comprising:
    a base film having a device hole to mount driving chips for driving the panel;
    an input pattern positioned on the base film and having a plurality of electrode pads connected to a side of the device hole;
    an output pattern positioned on the base film and having a plurality of electrode pads connected to the other side of the device hole; and
    connection parts positioned at the ends of the input pattern or the output pattern and having electrode pads of widths different from widths of the electrode pads.

2. The carrier package as set forth in claim 1, wherein the connection parts connect the input pattern to a connector of a printed circuit board.

3. The tape carrier package as set forth in claim 2, wherein the connection parts have electrode pads formed at intervals wider than intervals between the electrode pads of the input pattern.

4. The tape carrier package as set forth in claim 2, wherein the connection parts have electrode pads of widths narrower than widths of the electrode pads of the input pattern.

5. The tape carrier package as set forth in claim 2, wherein the connection parts comprise:
    first connection parts connected to the electrode pads of the input pattern; and
    second connection parts having electrode pads of widths different from widths of the first connection parts and being connected to the connector.

6. The tape carrier package as set forth in claim 5, wherein the second connection parts have electrode pads formed at intervals wider than intervals between the first connection parts.

7. The tape carrier package as set forth in claim 5, wherein the second connection parts have electrode pads of widths narrower than widths of the first connection parts.

8. The tape carrier package as set forth in claim 6, wherein the electrode pads of the second connection parts have widths such that the electrode pads are prevented from contacting bodies of the connector when the electrode pads are connected to the connector.

9. The tape carrier package as set forth in claim 5, wherein the second connection parts further comprise test pads formed at the ends of the second connection parts.

10. The tape carrier package as set forth in claim 9, wherein the test pads are positioned outside the base film.

11. The tape carrier package as set forth in claim 1, wherein the electrode pads of the connection parts are formed by dividing the electrode pads of the input pattern.

12. The tape carrier package as set forth in claim 1, wherein at least one of the input pattern, the output pattern, and the connection parts is plated with tin.

13. The tape carrier package as set forth in claim 1, further comprising a solder resist layer formed on the base film to cover the input pattern and the output pattern.

14. The tape carrier package as set forth in claim 9, wherein the base film further comprises at least one slit.

15. The tape carrier package as set forth in claim 9, wherein the base film further comprises sprocket holes formed at the lateral sides of the base film at regular intervals.

16. The tape carrier package as set forth in claim 1, wherein the connection parts connect the output pattern to the panel of the flat panel display.

17. The tape carrier package as set forth in claim 1, wherein the connection between the output pattern and the panel of the flat panel display is established by an isotropic conductive film.

18. The tape carrier package as set forth in claim 7, wherein the electrode pads of the second connection parts have widths such that the electrode pads are prevented from contacting bodies of the connector when the electrode pads are connected to the connector.

* * * * *